United States Patent [19]

Austin et al.

[11] Patent Number: 5,431,777

[45] Date of Patent: Jul. 11, 1995

[54] METHODS AND COMPOSITIONS FOR THE SELECTIVE ETCHING OF SILICON

[75] Inventors: Larry W. Austin, Hinesburg; Harold G. Linde, Richmond; James S. Nakos, Essex, all of Vt.

[73] Assignee: International Business Machines Corporation, Armonk, N.Y.

[21] Appl. No.: 947,645

[22] Filed: Sep. 17, 1992

[51] Int. Cl.$^6$ ............................................. H01L 21/00
[52] U.S. Cl. ................................ 156/622.1; 252/79.1; 252/79.5
[58] Field of Search ................... 252/79.1, 79.5, 79.4; 156/662, 647, 648, 649, 657

[56] References Cited

U.S. PATENT DOCUMENTS

| | | | |
|---|---|---|---|
| 3,160,539 | 12/1964 | Hall et al. | 156/17 |
| 3,506,509 | 11/1970 | Kragness et al. | 156/17 |
| 3,738,881 | 6/1973 | Erdman et al. | 156/17 |
| 3,765,969 | 10/1973 | Kragness et al. | 156/17 |
| 3,846,198 | 6/1974 | Wen et al. | 156/17 |
| 3,909,325 | 11/1975 | Church et al. | 156/17 |
| 4,113,551 | 3/1978 | Bassous et al. | 156/662 |
| 4,137,123 | 5/1979 | Bailey et al. | 156/647 |
| 4,567,451 | 1/1986 | Greenwood | 250/205 |
| 4,781,853 | 10/1988 | Lowry et al. | 252/79 |
| 4,859,280 | 7/1989 | Lowry et al. | 156/662 |
| 4,918,030 | 1/1990 | Lamb et al. | 437/225 |
| 4,941,941 | 3/1990 | Austin et al. | 156/647 |
| 4,983,246 | 1/1991 | Bunting | 156/240 |
| 5,185,294 | 2/1993 | Lam et al. | 437/193 |

FOREIGN PATENT DOCUMENTS 53-121459  10/1978  Japan .

OTHER PUBLICATIONS

Bassous "Anisotropic Etching of Silicon for 3-D Microstructure Fabrication" Electrochemical Society Symposium 1988 p. 23.

Kern "Chemical Etching of Silicon, Germanium, Gallium Arsenide, and Gallium Phosphide" *RCA Review* 39, 278-308 (1978).

Linde and Austin "Wet Silicon Etching with Aqueous Amine Gallates" *Journal of the Electrochemical Society* 139 1170-1174 (1992).

*Primary Examiner*—R. Bruce Breneman
*Assistant Examiner*—George Goudreau
*Attorney, Agent, or Firm*—Heslin & Rothenberg

[57] ABSTRACT

Methods and compositions for the selective etching of silicon in the presence of p-doped silicon are disclosed whereby a portion of a silicon surface may be dissolved while a p-doped pattern in the surface remains substantially undissolved. The compositions comprise (a) an aqueous solution of an alkali metal hydroxide or a tetraalkylammonium hydroxide; and (b) a high flash point alcohol, phenol, polymeric alcohol, or polymeric phenol.

7 Claims, 1 Drawing Sheet

METHODS AND COMPOSITIONS FOR THE SELECTIVE ETCHING OF SILICON

TECHNICAL FIELD

The invention relates to methods and compositions for the selective etching of silicon in the presence of p-doped silicon whereby a portion of a silicon surface may be dissolved while a p-doped pattern in the surface remains substantially undissolved. The compositions comprise (a) an aqueous solution of an alkali metal hydroxide or a tetraalkylammonium hydroxide; and (b) a high flash point alcohol, phenol, polymeric alcohol, or polymeric phenol.

BACKGROUND ART

The manufacture of semiconductor integrated circuits typically involves highly complex, time consuming and costly processes which, with continually narrower line width requirements, must be achieved with an ever increasing degree of precision. Within such processes the etching of semiconductor material (e.g., silicon) often entails the use of a chemical bath to which a patterned semiconductor material is exposed, so as to etch selectively certain portions of the surface of a wafer. In a typical chemical etch process, both the rate of etch and the selectivity of etch are parameters critical to the successful formation of an intended substrate geometry. For the fabrication of devices having a so-called surface "strap", it is desirable that an etchant be able to select between a silicon substrate and a p-doped pattern in the silicon. Thus, for fabricating a semiconductor device having a p-doped strap on a silicon surface, the silicon surface can be implanted or diffused with a p-type dopant, such as boron, in a pattern containing at least $2 \times 10^{19}$ atoms/cm$^3$ of boron in the appropriate configuration. If one then has an etchant that can distinguish between the p-doped silicon and the undoped silicon, one can dissolve a portion of the surface of the silicon and leave behind a raised pattern of p-doped straps.

It is known in the art to employ potassium hydroxide(KOH)-based etchants for anisotropically etching silicon, and various lower alkyl alcohols have been added to the KOH solution to control the etching process. Thus, Kragness et al. (U.S. Pat. No 3,506,509) describes an etchant comprising KOH, n-propanol and sec-butanol which is said to exhibit a substantially level etch rate. Erdman and Schmidt (U.S. Pat. No. 3,738,881) disclose an etchant comprising potassium, sodium, cesium, rubidium or quaternary ammonium hydroxide and an aliphatic alcohol. They indicate that aliphatic alcohols, such as n-propyl, isopropyl, n-butyl, sec-butyl, tert-butyl, pentyl and hexyl alcohols, are more suitable passivating agents for their purposes than are aromatic alcohols. Other patents disclose etchants comprising (a) alkali hydroxides and (b) methanol, ethanol, n-propanol, ethylene glycol, ethylene diamine, and other amines. Hall et al. (U.S. Pat. No. 3,160,539) disclose a solution of catechol in hydrazine as a silicon-selective etchant, although the significant hazards of hydrazine and the rapid oxidative deterioration of catechol make it industrially unattractive. Our own U.S. Pat. No. 4,941,941 discloses an etching solution comprising an aromatic compound having at least two adjacent hydroxyl groups, an amine and water. Two good reviews of anisotropic etching have been published: E. Bassous *Electrochemical Technology in Electronics ECS Symposium* 1988, p. 123 and W. Kern *RCA Review* 39, 278–308 (1978) p. 292.

Of the known methods for controlled etching, the combination of KOH and isopropanol is probably the most commonly used at present. Like all the other etchant compositions of the art, it suffers from two major drawbacks: (1) large proportions of the alcohol component are necessary to achieve modest selectivity between doped and undoped silicon, and (2) the alcohol must be used in an industrial setting at temperatures above its flash point.

Thus, there is a need for an etchant composition and method that do not give rise to the safety hazards associated with using flammable solvents above their flash points.

There is a further need for a composition and method that are highly selective for silicon in the presence of p-doped silicon.

DISCLOSURE OF INVENTION

It is an object of the present invention to provide an etchant composition that is highly selective for silicon in the presence of p-doped silicon.

It is a further object to provide an etchant composition that can be used well below the flash point of any component.

These and other objects and features are realized in the present invention, which relates to a method for the controlled etching of a silicon substrate comprising exposing the silicon substrate to a mixture of (a) an aqueous solution of a base chosen from the group consisting of alkali metal hydroxides and tetraalkylammonium hydroxides and (b) an alcohol of structure I:

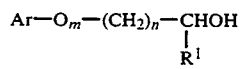

$$\text{Ar} - \text{O}_m - (\text{CH}_2)_n - \underset{\underset{R^1}{|}}{\text{CHOH}} \qquad \text{I}$$

wherein Ar is aryl or substituted aryl;
R' is hydrogen or linear lower alkyl;
n is zero or an integer from 1 to 4; and
m is zero or one.

When Ar is substituted aryl, the aryl is preferably substituted with lower alkyl or halogen. The term lower alkyl as used herein refers to hydrocarbon radicals of four or fewer carbon atoms.

Preferred alcohols are benzyl alcohol, α-methylbenzyl alcohol, phenoxyethanol and phenylpropanol and they are preferably present in an amount from 0.1% by weight to a saturated solution. Preferred bases are potassium hydroxide, sodium hydroxide or tetramethylammonium hydroxide and they are preferably at a concentration from 0.5 to 3.0N. Potassium hydroxide is most preferred.

In another aspect, the invention relates to a method for the controlled etching of a silicon substrate comprising exposing the silicon substrate to a mixture of (a) an aqueous solution of a base chosen from the group consisting of alkali metal hydroxides and tetraalkylammonium hydroxides and (b) a phenol or substituted phenol having one or more substituents chosen independently from the group consisting of alkyl, halogen, alkoxy and nitro. Preferably the phenol has the structure II:

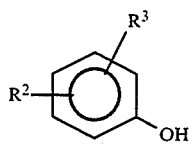

wherein $R_2$ is hydrogen or lower alkyl; and $R^3$ is hydrogen or lower alkyl.

Preferably the aqueous solution is from 0.5 to 3.0 N KOH and the phenol is a cresol.

In another aspect the invention relates to a method for the controlled etching of a silicon substrate comprising exposing the silicon substrate to a mixture of (a) an aqueous solution of a base chosen from the group consisting of alkali metal hydroxides and tetraalkylammonium hydroxides and (b) a polymer, the repeating units of which possess hydroxyl functions. Preferred polymers are novolac resins, poly(hydroxystyrenes) and poly(vinyl alcohols). A preferred novolac has the formula III:

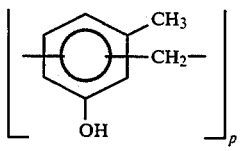

wherein p is from 20 to 85. In preferred embodiments, the aqueous solution is from 0.5 to 3.0 N KOH, the novolac is present in an amount from 0.05 ppm to 2% by weight and the silicon substrate is exposed to the mixture at about 45° to 105° C.

Preferred poly(hydroxystyrene)s have the formula IV:

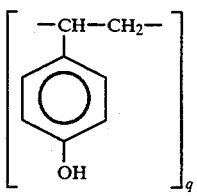

wherein q is from 20 to 200. The preferred styrenes are present in an amount from 0.05 ppm to 2% by weight. When the polymer is poly(vinyl alcohol), a preferred aqueous solution is from 0.5 to 3.0N KOH, the poly(vinyl alcohol) is of molecular weight from 5,000 to 10,000 and it is present in an amount from 0.01% to 5% by weight.

In another aspect, the invention relates to a method for fabricating a three-dimensional p-doped structure on a surface of a silicon wafer comprising:

(a) patterning the surface of the wafer with a pattern containing at least $2 \times 10^{19}$ atoms/cm$^3$ of p-dopant; and (b) exposing the surface to a solution of a polymer, an alcohol or a phenol and an aqueous base, said polymer having repeating units which possess hydroxyl functions, and said base chosen from the group consisting of alkali metal hydroxides and tetraalkylammonium hydroxides, whereby a portion of the silicon surface of the wafer is dissolved and the p-doped pattern remains substantially undissolved. When component (b) is an alcohol, the alcohol has the formula I. When component (b) is a phenol, the phenol has the formula II. When component (b) is a polymer, it is preferably a novolac of formula III, a poly(hydroxystyrene) of formula IV or a polyvinyl alcohol.

In a closely related aspect the invention relates to a method for etching a surface of a silicon substrate, said surface having implanted or diffused therein a boron-doped pattern with a dopant level above $2 \times 10^{19}$ atoms/cm$^3$. The method comprises exposing the surface to a solution of from 0.05 to 300 ppm of novolac resin in from 0.5 to 2.0N aqueous potassium hydroxide at 45° to 105° C. whereby a portion of the silicon substrate is dissolved and the boron-doped pattern remains substantially undissolved.

In a composition aspect, the invention relates to a composition for the controlled etching of silicon consisting essentially of:

(a) an aqueous solution of a base at a concentration from 0.5 to 3.0N, said base chosen from the group consisting of alkali metal hydroxides and tetraalkylammonium hydroxides; and (b) from 0.001% to 5% by weight of an alcohol of formula I. The composition may additionally contain a surfactant. In a preferred composition the base is potassium hydroxide and the alcohol is chosen from the group consisting of benzyl alcohol, α-methylbenzyl alcohol, phenoxyethanol and phenylpropanol.

In other composition aspects, the invention relates to similar compositions in which the alcohol of formula I is replaced by a polymer, the repeating units of which possess hydroxyl functions. Preferably, the polymer is a novolac resin of molecular weight 2,500 to 10,000. The compositions may also contain a surfactant the alcohol and polymer can be mixed.

BEST MODE FOR CARRYING OUT THE INVENTION

Figure 1:
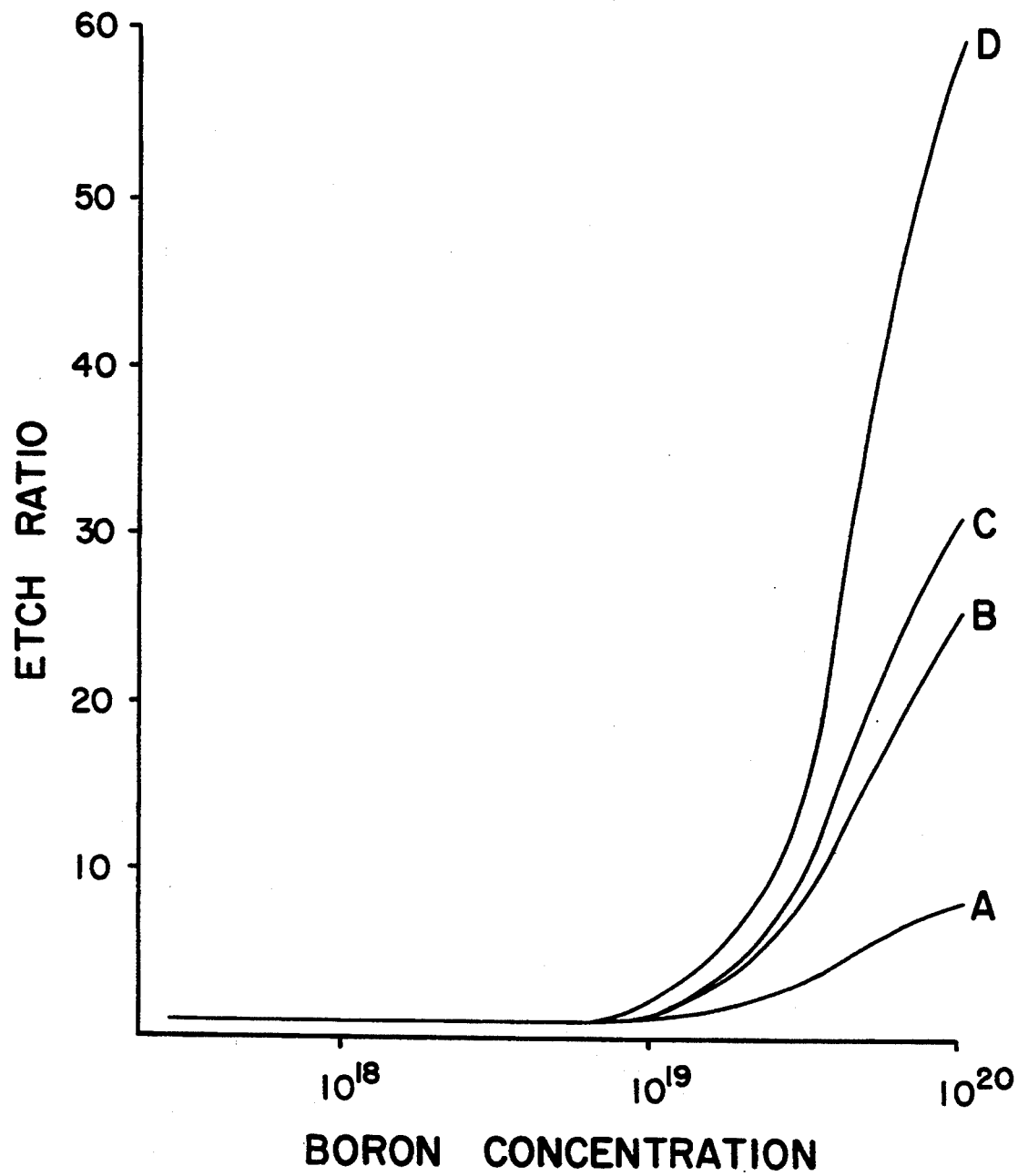
FIGURE 1 is a plot of etch ratio vs boron doping concentration for a solution of the art and three solutions of the invention.

According to the method of the invention, a silicon substrate having a p-doped pattern may be selectively etched so that the silicon is dissolved and the p-doped pattern remains substantially undissolved. The etch ratio between undoped and doped is a measure of the utility of the process: the higher the better. In addition, and relatedly, the lower the level of dopant required for functional differentiation, the better. That is, if one can reduce the level of p-dopant that must be implanted or diffused into the silicon to form the pattern and still have the etchant be able to select silicon over doped silicon, the fabrication is made simpler and less expensive.

It has been found that significant improvement over the compositions and methods of the art can be obtained, both in terms of selectivity and in terms of safety, by utilizing mixtures of typical bases known and used for etching silicon together with higher molecular weight hydroxyl-containing etch moderators.

FIGURE 1 illustrates the higher selectivity of the compositions of the invention. Curve A represents the etch ratio of a 2N KOH/25% isopropyl alcohol etchant of the art at 45° C. as a function of boron dopant concentration in atoms/cm³. Curves B, C and D are compositions of the invention. B is 2.5% benzyl alcohol in 2N KOH at 45° C.; C is 2.5% benzyl alcohol in 2N KOH at 60° C.; and D is 2.0% benzyl alcohol in 2N KOH at 45° C.

Typical bases include alkali metal hydroxides, such as sodium, potassium, and, less commonly, cesium and rubidium hydroxides. Another class of basic etchant often used when alkali metal ions would interfere with subsequent processing, is the "metal-ion-free" or "MIF" class. These are primarily tetraalkyl ammonium hydroxides, the most commonly used MIF being tetramethylammonium hydroxide (TMAH). When used alone, the basic etchants above show no useful selectivity between doped and undoped substrates.

Although the inventor does not wish to be bound by any theoretical explanation for the results, it is possible that the aralkyl alcohol and polymeric alcoholic moderators interact with existing or nascent Si-OH groups on the surface of the silicon, thereby restricting access to the surface by the base. The advantage to the polymers arises from their ability to complex extensively with the surface. This may be reflected in the observation that relatively small amounts of the polymers are very effective. In any event, among aralkyl alcohols, benzyl alcohol, α-methylbenzyl alcohol, phenoxyethanol and phenylpropanol seem particularly well suited to the method of the invention. Among the members of the genus of structure I, 2-phenylethanol has also been tested but is less selective, which may be a function of its lower solubility in the aqueous etchant solution. Monomeric phenols, depicted by formula II, tend to be soluble to a greater extent than aralkyl alcohols and are very effective moderators. However, mammalian toxicity makes some of the phenols less attractive in an industrial process. Polyhydroxyphenols, particularly catechols and hydroquinones, and to a lesser extent, resorcinols, tend to oxidize and are therefore not preferred for the inventive etchants. In this regard, it has been found that the results of processes that employ benzyl alcohol at elevated temperatures are improved by restricting the opportunities for its oxidation, for example, by blanketing the solution with an inert gas. The hydroxyl-containing moderators are useful up to the limit of their solubility in the aqueous base. This will, of course, be a function of the temperature at which the etch is performed.

In the process of the invention, the etch can be carried out at any temperature from ambient to the boiling point of the solution. For practical purposes the etch is preferably carried out above 45° C., and, as will be seen below, the selectivity of some of the moderators improves as the temperature increases. The boiling point will depend to some extent on the concentration of base, 3.0N solutions having a boiling point a few degrees higher than 100° C.

The etchant solutions may be used for fabricating three-dimensional p-doped structures on the surface of silicon wafers. For example, a wafer is implanted with a pattern by ion implantation or by diffusion through a pattern in a mask; a layer of polysilicon is deposited on the surface of the wafer; and the wafer is heated to diffuse the dopant, usually boron, into the polysilicon in a pattern reflecting the original. The polysilicon surface of the wafer is then exposed to the etchant solutions of the invention, and the undoped polysilicon is dissolved away, leaving the p-doped polysilicon behind as a raised pattern on the surface of the wafer. In this process, the less boron that must be implanted or the less strenuous heating conditions (time and temperature) to diffuse the pattern, the better. Thus, selectivity of the etchant is a major determinant of the economics of the process, and the etchants of the invention are a significant advance over the art.

Several experiments were undertaken to demonstrate the improved selectivity of the solutions of the invention. (The safety improvements are readily shown from an examination of the flash points of the compounds of the inventive solutions, which are available in references of the art.)

Each of the etchants found in the Results section was prepared from stock solutions which were approximately 2N KOH. Solutions of alcohols were formulated by adding the appropriate amount of alcohol to 100 mL of 2N KOH stock solution and, if incompletely dissolved, rolling on a roller mill overnight. This procedure produced solutions saturated at room temperature. The undissolved alcohol was removed using a separatory funnel. Samples of boron-doped (3 to $6 \times 10^{19}$ atoms/cm³) or intrinsic polysilicon films were deposited on silicon wafers. These films were etched at a given temperature, and the rate of dissolution was calculated. Conditions for the individual runs appear in Table I. A one-minute 10:1 buffered oxide etch clean step preceded the alcoholic etch step.

The rate of dissolution of intrinsic polysilicon, of boron-doped polysilicon and the ratio of the two rates are shown in Table I. By comparison, the existing standard technology, 25% isopropyl alcohol at 45° C. (flash point =22° C.) in 2N KOH exhibits an etch ratio of about 6. The term "substantially undissolved" as used herein thus refers to differential dissolution where the etch ratio is about 6 or more.

TABLE I

| Moderator | Temp. | Conc. | Rate I (Å/min) | Rate B (Å/min) | Ratio |
|---|---|---|---|---|---|
| PhCH₂OH | 45 | 2% | 149ª | 45 | 6.0* |
| | 45 | 2% | 946 | 172 | 5.5* |
| | 45 | 2% | 400 | 16.8 | 23.8** |
| | 45 | 2.2% | 828 | 142 | 5.8* |
| | 45 | 1.8% | 1121 | 176 | 6.4* |
| PhCH(CH₃)OH | 45 | sat'd | 143 | 8.2 | 17.2* |
| | 45 | 1.5% | 158 | 32 | 4.9* |
| | 45 | 0.45% | 271 | 18 | 15 |
| | 55 | 0.50% | 285 | 53 | 5.4 |
| PhOCH₂CH₂OH | 45 | sat'd | 267 | 38 | 7.1* |
| PhCH₂CH₂OH | 45 | sat'd | 127 | 37.2 | 3.4* |
| PHCH₂CH₂CH₂OH | 45 | sat'd | 190 | 30.8 | 6.1* |
| o-cresol | 45 | 9% | 32 | 5.8 | 5.6* |
| | 45 | 1% | 62 | 8.8 | 7.1 |
| | 45 | 2% | 44 | 7.5 | 5.9 |

TABLE I-continued

| Moderator | Temp. | Conc. | Rate I (Å/min) | Rate B (Å/min) | Ratio |
|---|---|---|---|---|---|
| | 45 | 3% | 56 | 10.5 | 5.3 |
| | 45 | 4% | 40.1 | 12.5 | 3.2 |
| m-cresol | 45 | 9% | 123 | 10.5 | 11.7* |
| novolac | 45 | 1% | 75 | 6.3 | 12 |
| | 45 | 2% | 82 | 8.2 | 10 |
| | 45 | 3% | 72 | 8.3 | 8.8 |
| | 45 | 4% | 80.6 | 7.6 | 10.6 |
| | 55 | 4% | 139 | 13.1 | 10.7 |
| | 65 | 4% | 317.5 | 22.5 | 14.1 |
| | 50 | 2% | 59 | 6.6 | 9.0 |
| | 55 | 2% | 103 | 5.8 | 17.8 |
| | 60 | 2% | 165 | 8.6 | 19.3 |
| | 65 | 2% | 241 | 10.7 | 22.5 |
| | 70 | 2% | 317 | 13.3 | 23.8 |
| | 50 | 1% | 75 | 6.1 | 12.3 |
| | 55 | 1% | 116 | 8.2 | 14.1 |
| | 60 | 1% | 154 | 5 | 30.8 |
| | 65 | 1% | 245 | 8.2 | 29.9 |
| | 70 | 1% | 366 | 11.3 | 32 |
| | 104 | 3% | $2.26 \times 10^3$ | — | — |
| | 104 | 0.1% | $3.55 \times 10^3$ | — | — |
| | 104 | 66.6 ppm | $5.12 \times 10^3$ | — | — |
| | 104 | 6.6 ppm | $9.83 \times 10^3$ | — | — |
| | 104 | 0.6 ppm | $2.01 \times 10^4$ | — | — |
| | 104 | 0.3 ppm | $3.3 \times 10^4$ | — | — |
| | 104 | 0.06 ppm | $3.33 \times 10^4$ | — | — |
| | 104 | 0 | $3.33 \times 10^4$ | — | — |
| poly(vinyl alcohol) | 104 | 1.5% | $5.8 \times 10^{2\,2}$ | — | — |
| mw ~ 5000 | 104 | 1.0% | $5.5 \times 10^2$ | — | — |
| | 104 | 0.3% | $7.0 \times 10^3$ | — | — |
| | 104 | 0.1% | $1.1 \times 10^4$ | — | — |
| | 104 | 0.05% | $1.7 \times 10^4$ | — | — |

*The values marked were obtained under non-equilibrium conditions (no stirring). Unmarked values were obtained with stirred solutions.
**This value was obtained on production runs in the appropriate equipment.
$^a$The difference in absolute dissolution rates between two 2% benzyl alcohol samples is believed due to variations in the KOH concentration. The ratio is unaffected.

An additional feature of the use of low concentrations of novolac as the moderator was the observation that at low KOH concentration (0.5 to 1.0N) and less than 0.1 ppm novolac, the silicon surface that emerged after etching and rinsing appeared unusually smooth. For certain applications there may be an additional advantage to this apparent improvement in etch uniformity.

The alcohols of formula I, the phenols of formula II, and the polymers of formulas III and IV as well as the poly(vinylalcohols) may be prepared by procedures well known in the art. Most are commercially available. The novolac resins, which are available from Shipley (Newton, Mass.) and Kodak (Rochester, N.Y.), are particularly attractive candidates as moderators because they do not exhibit measurable flash points and, in the quantities needed, they are inexpensive to purchase and to dispose of properly after use. Novolac resins are phenol-formaldehyde resins; a procedure for their manufacture is described in *Chemistry and Application of Phenolic Resins,* Knop and Scheib, Springer Verlag N.Y. 1979.

Because surfactants are occasionally included in etch solutions, a potassium perfluorocarboxylate surfactant (FC-129, 3M, St. Paul, Minn.) was included in one experiment with 0.5% α-methylbenzyl alcohol; the etch ratio was reduced from 15 to 8.4. Apparently this particular surfactant interferes to some extent with the protection afforded by α-methylbenzyl alcohol. Nonetheless, the solution still exhibits very good selectivity and the inclusion of surfactants may, in some instances, provide advantages that offset their diminution of the etch ratio. Examples of surfactants that are commonly used in etchant solutions include Fluorad TM (3M-St. Paul) and Dowfax (Dow, Midland, Mich.).

While the invention has been particularly shown and described with reference to preferred embodiments thereof, it will be understood by those skilled in the art that other changes in form and details may be made therein without departing from the spirit and scope of the invention.

We claim:

1. A method for the controlled etching of a silicon substrate comprising exposing said silicon substrate to a mixture of (a) an aqueous solution of a base chosen from the group consisting of alkali metal hydroxides and tetraalkylammonium hydroxides and (b) an alcohol of structure

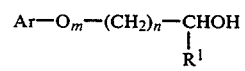

wherein Ar is aryl or substituted aryl;
R' is hydrogen or linear lower alkyl;
n is zero or an integer from 1 to 4; and
m is zero or one.

2. A method according to claim 1 wherein Ar is aryl or aryl substituted with alkyl of 1 to 4 carbons or halogen.

3. A method according to claim 1 wherein said alcohol is present in an amount from 0.1% by weight to a saturated solution.

4. A method according to claim 3 wherein said aqueous base is potassium hydroxide, sodium hydroxide or tetramethylammonium hydroxide.

5. A method according to claim 4 wherein said aqueous solution of a base is from 0.5 to 3.0N potassium hydroxide.

6. A method according to claim 3 wherein said alcohol is chosen from the group consisting of benzyl alcohol, α-methylbenzyl alcohol, phenoxyethanol and phenylpropanol.

7. A method for fabricating a p-doped structure on a surface of a silicon wafer comprising:
   (a) patterning said surface of said wafer with a pattern containing at least $2 \times 10^{19}$ atoms/cm$^3$ of p-dopant; and
   (b) exposing said surface to a solution of an alcohol and an aqueous base, said alcohol having the formula

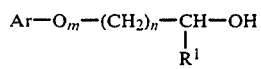

wherein Ar is aryl or aryl substituted with lower alkyl or halogen;
R' is hydrogen or linear lower alkyl;
n is zero or an integer from 1 to 4; and
m is zero or one;
and said base is chosen from the group consisting of alkali metal hydroxides and tetraalkylammonium hydroxides, whereby a portion of said silicon surface of said wafer is dissolved at a rate at least 6 times that of said pattern.

* * * * *